(12) United States Patent
Furukawa et al.

(10) Patent No.: US 6,194,268 B1
(45) Date of Patent: Feb. 27, 2001

(54) PRINTING SUBLITHOGRAPHIC IMAGES USING A SHADOW MANDREL AND OFF-AXIS EXPOSURE

(75) Inventors: Toshiharu Furukawa, Essex Junction; Mark C. Hakey; Steven J. Holmes, both of Milton; David V. Horak, Essex Junction; Paul A. Rabidoux, Winooski, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/183,926

(22) Filed: Oct. 30, 1998

(51) Int. Cl.[7] ............................................. H01L 21/336
(52) U.S. Cl. ........................... 438/257; 438/712; 438/944
(58) Field of Search .................. 438/257, 571, 438/712, 944; 430/314

(56) References Cited

U.S. PATENT DOCUMENTS

| | | | |
|---|---|---|---|
| 3,908,263 | 9/1975 | Matarese | 29/592.1 |
| 4,280,854 | 7/1981 | Shibata et al. | 438/525 |
| 4,525,919 | 7/1985 | Fabian | 438/577 |
| 4,536,942 | 8/1985 | Chao et al. | 438/574 |
| 4,551,905 | 11/1985 | Chao et al. | 438/570 |
| 4,618,510 | 10/1986 | Tan | 438/571 |
| 4,673,960 | 6/1987 | Chao et al. | 257/283 |
| 4,687,730 | 8/1987 | Eron | 430/324 |
| 4,761,464 | 8/1988 | Zeigler | 528/30 |
| 5,126,288 | 6/1992 | Nakagawa | 438/712 |
| 5,185,214 | 2/1993 | Lam et al. | 438/515 |
| 5,306,390 | 4/1994 | Peek | 438/524 |
| 5,366,849 | 11/1994 | Nakagawa et al. | 430/314 |

OTHER PUBLICATIONS

Research Disclosure, "A Sidewall Image Definition Technique fo Producing Extremely Fine Semiconductor Chip Features", 277 (1987) 296.*
IBM Technical Disclosure Bulletin, "Line and Via Interconnect Structure Using a Single Mask", 32 (May 1990) 146.*
Timothy W. Weidman and Ajey M. Joshi, "New Photodefinable Glass Etch Masks for Entirely Dry Photolithography: Plasma Deposited Orgnosilicon Hydride Polymers", Appl. Phys.Lett 62(4), Jan. 25, 1993.
R.L. Kostelak, T.W. Weidman, and S. Vaidya, "Application of Plasma Polymerized Methylsilane Resist For All–Dry 193 nm Deep Ultraviolet Processing", J. Vac.Sci.Technol.B 13(6), Nov./Dec. 1995.
Derwent World Patent Index, "Japanese Patent No. 2010535 Abstracts", Jan. 16, 1990.

* cited by examiner

Primary Examiner—Richard Elms
Assistant Examiner—Christian D. Wilson
(74) Attorney, Agent, or Firm—Schmeiser Olsen& Watts Eugene Shkurko (57) ABSTRACT

The present invention overcomes the limitations of the prior art to allow for the creation of smaller components for use in logic circuits. The invention provides a new method of defining and forming features on a semiconductor substrate by using a layer of material, referred to as a shadow mandrel layer, to cast a shadow. A trough is etched in the shadow mandrel layer. At least one side of the trough will be used to cast a shadow in the bottom of the trough. A conformally deposited photoresist is used to capture the image of the shadow. The image of the shadow is used to define and form a feature. This allows for the creation of images on the surface of a wafer without the diffraction effects encountered in conventional photolithography. This allows for a reduced device size and increased chip operating speed.

48 Claims, 12 Drawing Sheets

PRINTING SUBLITHOGRAPHIC IMAGES USING A SHADOW MANDREL AND OFF-AXIS EXPOSURE

BACKGROUND OF THE INVENTION

I. Technical Field

This invention relates, in general, to the fabrication of semiconductor devices. More particularly, this invention relates to the creation of features on semiconductor devices having sublithographic dimensions.

II. Background Art

Semiconducting microchips have become an integral part of everyday life. Semiconducting microchips are used in everything from toys to garage door openers, and most particularly in computers. The semiconductor industry has relentlessly sought to increase the speed at which a chip may function. One way to increase the speed at which a chip operates is to decrease the size of the circuit components in a logic chip. Decreased logic component size allows each component to operate more rapidly, as an electrical signal may traverse the circuit component in less time.

The components of a chip are created using a process known as photolithography. Conventional photolithography works by placing appropriate materials and light sensitive chemicals known as photoresists, or simply "resists", on the surface of a semiconductor wafer and then selectively exposing portions of the surface of the semiconductor wafer to light of a carefully selected wavelength. Various chemical processes allow materials to be added or removed at a location depending upon whether the location was exposed to light of particular wavelength. A particular area is exposed or not exposed by placing a mask between the light source and the wafer's surface. The mask allows light to pass through at certain points and blocks light at other points, thus printing a pattern on the surface of the wafer.

Conventional photolithography is limited by the diffraction effects of light passing through the mask. Due to the wave nature of light, any image made using a mask will be somewhat blurred by diffraction effects. This blurring due to diffraction effects is insignificant for large images. However, as the size of images shrink this blurring becomes more and more significant, until the image itself is obliterated by the blurring. Thus, conventional photolithography using a mask is practical only down to certain lower limits. Those limits are presently being reached. This blurring due to diffraction is one of the grave obstacles to the further miniaturization of circuitry on microchips. While image enhancement techniques have been developed to overcome, to a degree, the diffraction effects that distort an image, there still exists an image size below which traditional photolithography cannot function. To somehow go beyond the lower limits of traditional photolithography would allow the size of logic circuit components to be reduced, thus increasing the operating speed of the resulting semiconductor chips.

DISCLOSURE OF INVENTION

The present invention overcomes the limitations of the prior art to allow for the creation of smaller components for use in semiconductor logic circuits. The invention provides a new method of defining and forming features on a semiconductor substrate by using a layer of material, referred to as a shadow mandrel layer, to cast a shadow. A trough is etched in the shadow mandrel layer. At least one side of the trough will be used to cast a shadow in the bottom of the trough. A conformally deposited photoresist is used to capture the image of the shadow. The image of the shadow is used to define and form a feature. This allows for the creation of images on the surface of a wafer without the diffraction effects encountered in conventional photolithography. This allows for a reduced device size and increased chip operating speed.

BEST MODE FOR CARRYING OUT THE INVENTION

According to the present invention a new process referred to as shadow lithography is used to define and form features on a semiconductor substrate. The feature defined and formed may be any feature needed in the creation of semiconductor circuitry. While the example illustrated in the preferred embodiment defines and forms a gate, it is to be understood that the present invention may be applied to the creation of any feature on a semiconductor wafer. According to the preferred embodiment of the invention, a layer of material, referred to as the shadow mandrel layer, casts a shadow which is used to define a feature. To cast the shadow, a trough is etched in the shadow mandrel. A conformal deposition photoresist is deposited over the surface of the wafer, including the trough. The photoresist is then exposed at an angle such that at least one side of the trough casts a shadow in the bottom of the trough. The exposure is preferably performed using an ion implantation, but may be performed using other methods, such as optical, ultraviolet, deep ultraviolet, x-ray, or electron beam exposures. The photoresist is developed and the image of the shadow is used to define and form a feature. In accordance with the preferred embodiment, the feature defined is a gate. However, one skilled in the art will realize that the present invention may be used to define any feature needed on a semiconductor substrate.

Figure 1:
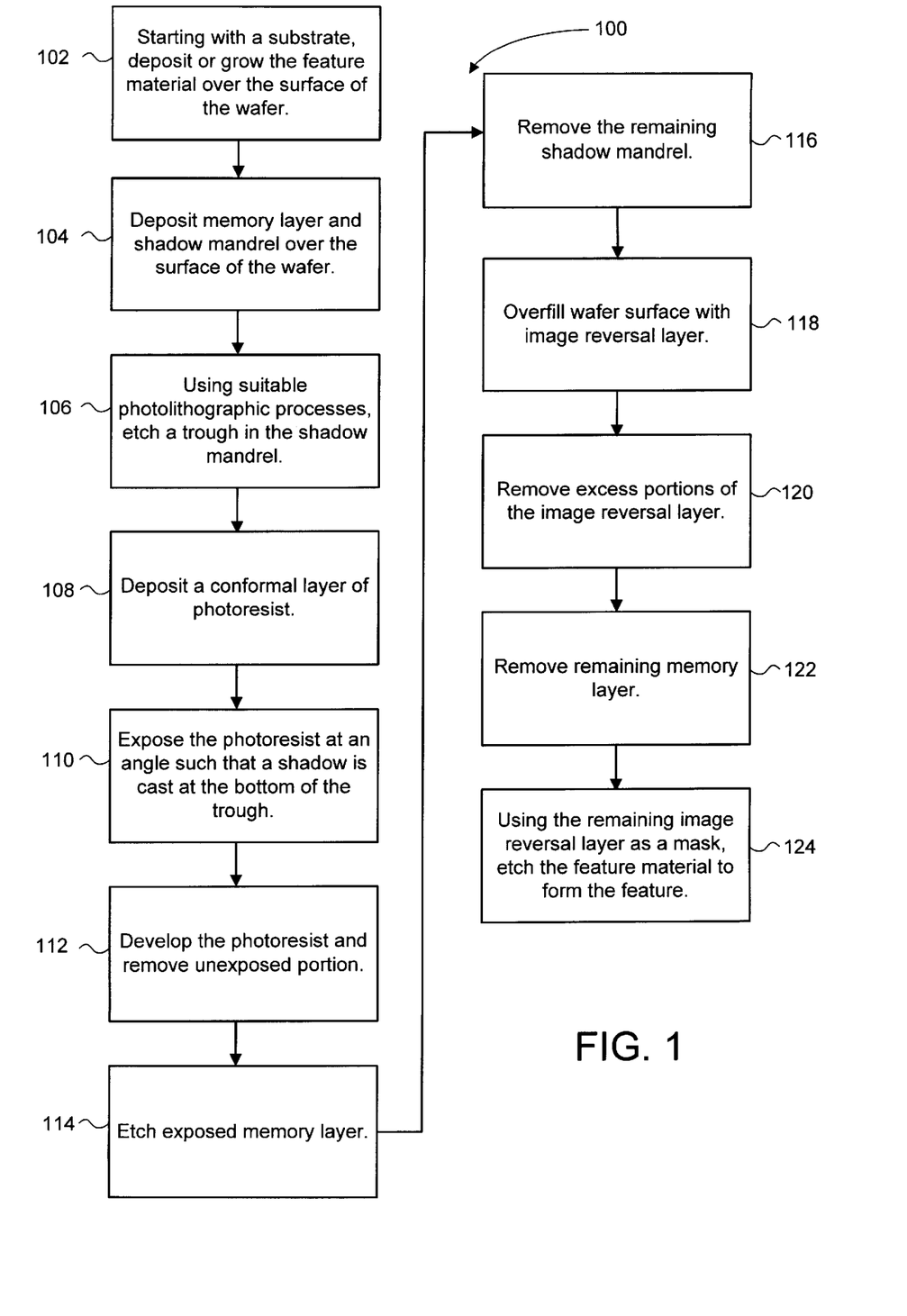
FIG. 1 is a method in accordance with the preferred embodiment.

Referring now to FIG. 1, a method 100 in accordance with the preferred embodiment of the invention is shown. The example method 100 in accordance with the preferred embodiment is particularly well suited to the formation of logic gate. The method 100 describes the steps necessary to define and form a feature in accordance with the preferred embodiment. The first step 102 of method 100 is to start with a substrate, typically a planar wafer, and deposit or grow the appropriate feature material over the surface of the wafer. Because the feature defined in accordance with the preferred embodiment is a gate, the feature material may comprise a gate conductor and dielectric, such as silicon dioxide and polysilicon. The feature material may alternatively comprise any other material suitable for use in forming a gate. Of course, if the feature to be defined is not a gate, feature material appropriate for that feature should be used. In some circumstances, the substrate itself may appropriately comprise the feature material. For example, one feature that may be defined and formed using shadow lithography is a contact hole. This may be accomplished in accordance with the invention described herein for example, by printing elongated images suitable for the application of image enhancement techniques to form troughs and then using shadow lithography to reduce the size of the image ultimately used to form the contact hole. The next step 104 is to deposit a memory layer and a shadow mandrel over the surface of the wafer. The memory layer will later be used as a hard mask and to retain the shadow image used in defining the feature to perform an image reversal. The shadow mandrel will be used as a shadow casting layer to cast the shadow which will define the feature. In accordance with the preferred embodiment, the memory layer is a thin layer of nitride and the shadow mandrel is a thick layer of tetraethoxysilane ("TEOS"). The thickness of the shadow mandrel layer is one factor which determines the feature size attained in accordance with the present invention. One skilled in the art will realize that other materials may be used and that the dimensions of both the memory layer and the shadow mandrel will vary depending upon the specific application of the invention and the feature which is to be defined and formed.

Figure 2:
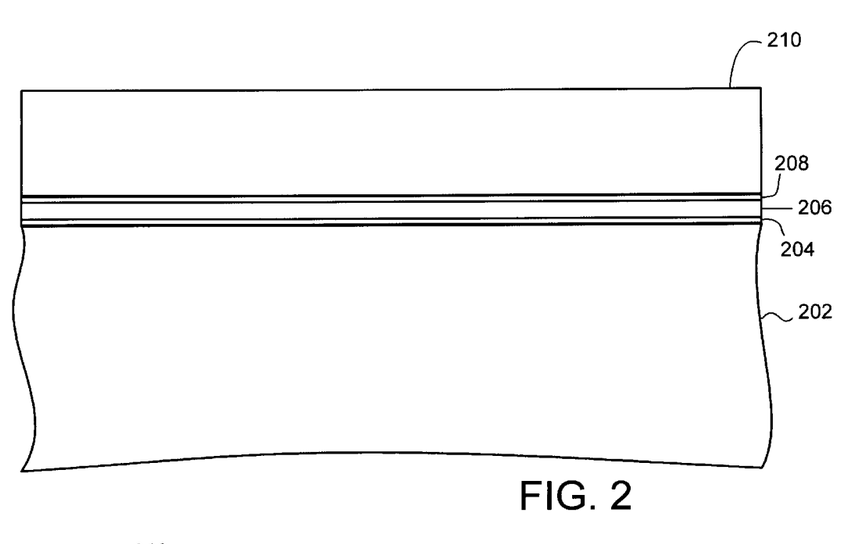
FIG. 2 shows a cross-section of a semiconductor wafer being processed in accordance with the preferred embodiment of the present invention.

FIG. 2 shows a planar wafer 202 after step 104 of the method 100. A layer of gate oxide 204 has been grown on the surface of the wafer 202. Gate polysilicon 206 has been deposited over the gate oxide 204. The memory layer comprises a layer of nitride 208 that has been deposited over the gate polysilicon 206. Above the layer of nitride 208 is a shadow mandrel layer, which comprises a thick layer of TEOS 210. The layer of TEOS 210 will later be used to cast the shadow which will define a gate. The gate polysilicon 206 and gate oxide 204 may be replaced with any other suitable materials. If the feature to be defined and formed is not a gate, material appropriate for that feature should be used instead of gate polysilicon 206 and gate oxide 204. Likewise, any suitable hard mask material may be substituted for the nitride 208. For some purposes, such as is disclosed in conjunction with the second embodiment, the layer of nitride may be omitted altogether. The TEOS 210 may be replaced with any suitable material.

Referring again to FIG. 1, the next step 106 of method 100 is to etch a trough in the shadow mandrel using any suitable photolithographic processes. Step 106 may include the process of applying a photoresist over the surface of the shadow mandrel, masking and exposing the photoresist to pattern the trough(es), developing the photoresist and etching the trough(es). Preferably, the trough(es) will be the minimum feature size attainable with the photolithographic process used. One side of a resulting trough will be used to cast a shadow on the underlying memory layer to define the feature. The next step 108 of the method 100 is to deposit a conformal layer of photoresist over the surface of the wafer, including the bottom and sidewalls of the trough. The type of exposure used will determine, to a degree, what type of photoresist is suitable for use, because the photoresist must respond to the exposure used. In the preferred embodiment, the photoresist is deposited using chemical vapor deposition (CVD) to allow the resist to adhere to the sidewalls and bottom of the trough.

One example of a suitable resist is a plasma polymerized polysilane resist as described in Microelectronic Engineering, Vol. 30, 1996, pp. 275–78. This resist has several unique properties. First, it can be developed as both positive and negative tone resist. Second, the resist can be conformally deposited using a chemical vapor deposition process. Third, it can be activated by two types of exposures, an oxygen ion implantation or by irradiation with ultraviolet light in the presence of oxygen. During either type of exposure, the silicon-silicon bonds are cleaved, and oxygen reacts with the activated silicon atoms. Silicon dioxide is formed in the exposed areas as a result of this reaction. This resist may be developed as positive tone resist using buffered hydrogen flouride (HF) or a flourine plasma. This resist may be developed as a negative tone resist using chlorine plasma.

In the preferred embodiments of the present invention the polysilane resist is used in both its negative tone and positive tone manner. In the first embodiment the resist is implanted with oxygen ions, and then developed with a chlorine or bromine developer that removes only those portions of resist that were not implanted with oxygen. In the second embodiment the resist is implanted with oxygen and then developed with a hydrofluoric acid based or flourine plasma developer that removes only those portions of resist that were implanted with oxygen.

Another material that can be used as an implant sensitive resist is polysilicon. Polysilicon can be conformally deposited using any conventional technique. Polysilicon can be made insoluble in potassium hydroxide/isopropyl alcohol developer with a suitable boron implant, while unimplanted areas remain soluble to that developer.

In accordance with the preferred embodiment, the photoresist is developed as a negative tone resist. One skilled in the art will realize that other types of resists may be used in accordance with the invention.

The next step 110 of method 100 is to expose the wafer at a non-perpendicular angle such that a shadow is cast in the trough. In the preferred embodiment, this exposure comprises implanting oxygen ions using an appropriate implantation tool. These tools typically use electric fields to accelerate the ions toward the surface of the wafer, causing them to be implanted into the surface. As previously explained, however, the exposure may comprise methods other than ion implantation, such as optical, ultraviolet, deep ultraviolet, x-ray, or electron beam exposures.

Figure 3:
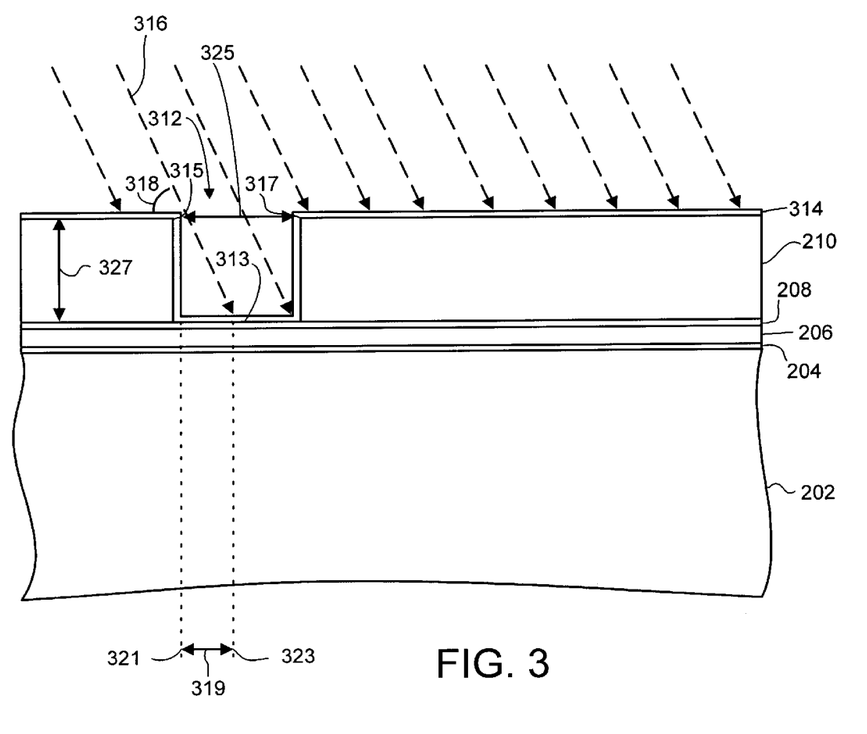
FIG. 3 shows a cross-section of a semiconductor wafer being processed in accordance with the preferred embodiment of the present invention.

The exposure of step 110 in accordance with the preferred embodiment is shown in FIG. 3. A trough 312 has been etched in TEOS 210. The trough 312 has a bottom 313, a first sidewall 315, and a second sidewall 317. The trough 312 has a width 325 and a depth 327. A conformal layer of polysilane photoresist 314 has been deposited over the surface of the wafer 202. The wafer 202 is then exposed to ion implantation 316 of oxygen at a non-perpendicular angle 318. The first sidewall 315 of the trough 312 therefore casts a shadow 319 at the bottom 313 of the trough 312. This results in an unexposed portion of photoresist at the bottom of the trough 312. The polysilane photoresist layer 314 used in the preferred embodiment will be developed as a negative tone photoresist, so the unexposed portion will be removed when developed. The dimensions of this shadow 319 are determined solely by the angle 318 of the exposure and the depth 327 of the trough 312. If the dimension of the shadow 319 is designated "s", the depth 327 of the trough 312 is designated "d", and the exposure angle 318 is designated "$\phi$", then the dimension of the shadow 319 is given by the equation $$s = d \tan(90-\phi).$$

A suitable exposure angle 318 is about 70 degrees. Of course, other angles may be used. A suitable depth 327 is about 3,000 Angstroms. The thickness of TEOS 210 and the corresponding depth 327 of the trough 312 can be controlled with great accuracy, with only approximately a one to two percent variance. Likewise, the exposure angle 318 can be determined very precisely. Thus, the dimensions of the shadow 319 may be tightly controlled. Due to the use of ion implantation, the shadow's 319 image is not the subject to the diffraction effects of traditional photolithography. The shadow 319 is self-aligned at its first edge 321 with the first sidewall 315 of the trough 312. The second edge 323 of the shadow 319 is determined by the exposure angle 318 and the depth 327 of the trough 312, as set forth above.

When using a polysilicon resist, boron is preferably implanted to make the exposed polysilicon insoluble in developer. This implant is preferably performed using a ion implant tool that accelerates boron towards the surface of the wafer, causing it to be implanted into the polysilicon resist. Typically a $BF_2$ implant of $1\times10^{15}$–$1\times10^{18}$ ions/cm$^3$ at 10 KeV is preferable to make the polysilicon resist insoluble in developer.

Referring again to FIG. 1, the next step 112 of method 100 is to develop the photoresist. This removes the unexposed portions of the photoresist. In the preferred embodiment this step 112 may be done using any suitable etch, such as a chlorine etch. In the next step 114 the undeveloped photoresist and the underlying memory layer are etched, creating a depression in the memory layer where the shadow was cast. In the preferred embodiment step 114 is accomplished with a second dry etch. This depression will be used in the creation of the feature.

Figure 4:
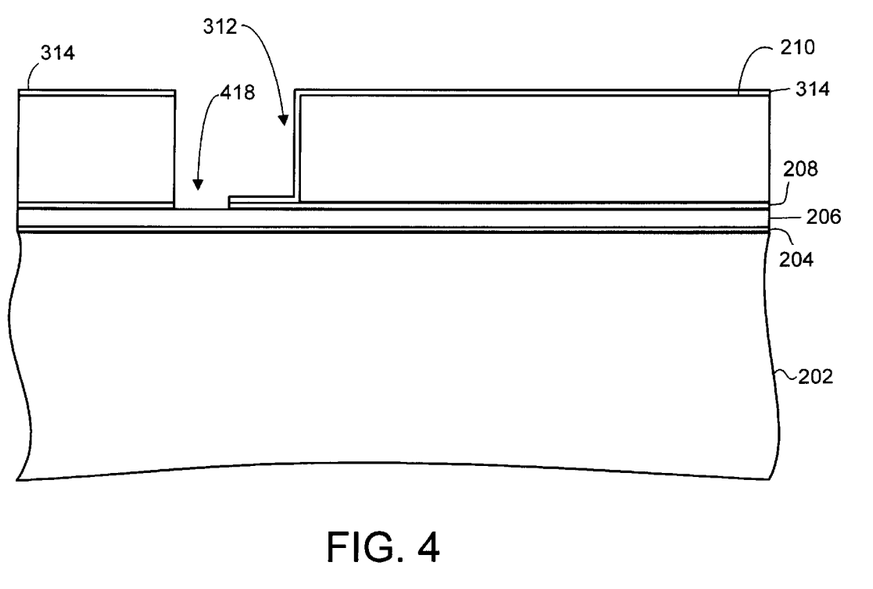
FIG. 4 shows a cross-section of a semiconductor wafer being processed in accordance with the preferred embodiment of the present invention.

The results of step 114 are shown in FIG. 4. The unexposed portions of the photoresist 314 and layer of nitride 208 have been removed where the shadow 319 was cast, resulting in a depression 418 which is self-aligned with the edge of the shadow mandrel. Thus, the layer of nitride 208 serves as a memory layer that preserves the feature defined by the shadow 319 for purposes of reversing the image.

Referring again to FIG. 1, the next step 116 of method 100 is to remove the remaining portions of the shadow mandrel from the surface of the wafer. In accordance with the preferred embodiment, a hydrogen flouride (HF) dip may be used. The next step 118 of method 100 is to deposit an image reversal layer on the surface of the wafer to completely fill the depression etched in the memory layer. In accordance with the preferred embodiment, the image reversal layer is a thin layer of TEOS. Of course, materials other than TEOS may be used for the image reversal layer. The material used for the image reversal layer should preferably have a good polish ratio to the masking layer, and a good etch ratio to the masking layer. For example, an etch ratio of three or four to one is acceptable. The image reversal layer should also be selected to be a material that will not be etched during the removal of the memory layer and to be a good hard mask for the subsequent etch of the feature material. The portion of the image reversal layer that fills the depression will later be used as a hard mask in the creation of the feature.

Figure 5:
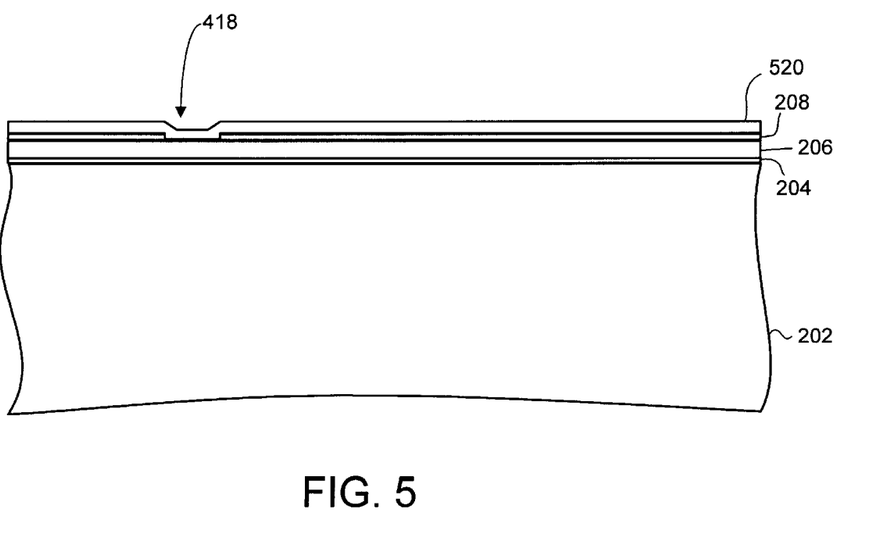
FIG. 5 shows a cross-section of a semiconductor wafer being processed in accordance with the preferred embodiment of the present invention.

An overfilled wafer after the completion of step 118 is shown in FIG. 5. A thin layer of TEOS 520 has been deposited over the surface of the wafer, filling the small depression 418.

Referring again to FIG. 1, the next step 120 of method 100 is to remove the excess portions of the image reversal layer. This can be accomplished by planarizing the image reversal layer such that only the portion of the image reversal layer contained in the depression remains. This is done so that the shadow image preserved by the image reversal layer in the depression may be used to define a feature in a later etch step, for which the remaining portion of the image reversal layer will serve as a hard mask.

Figure 6:
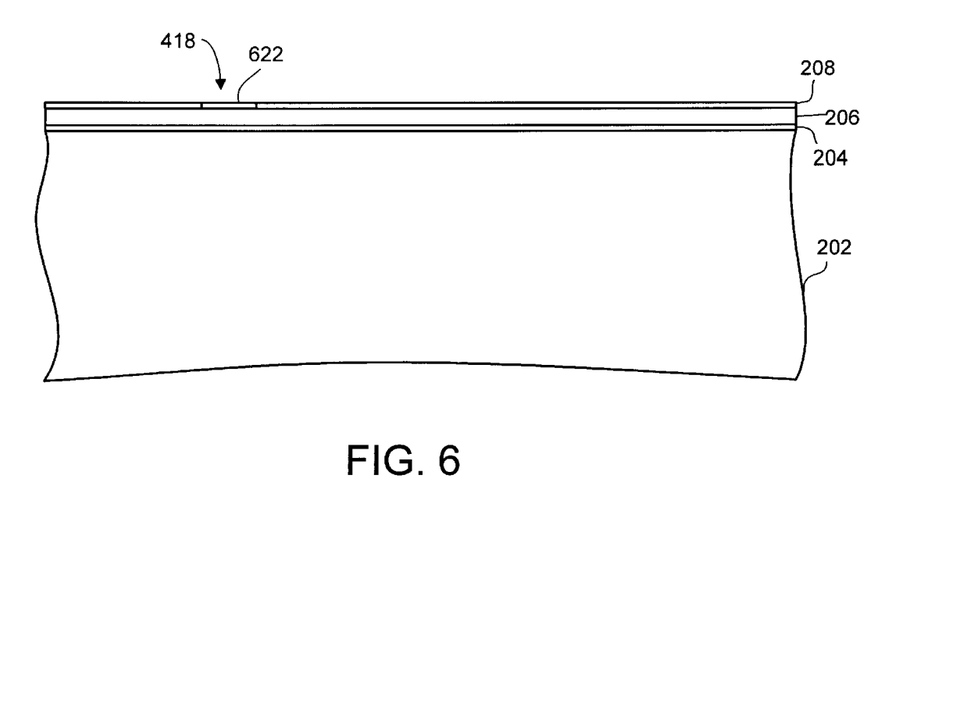
FIG. 6 shows a cross-section of a semiconductor wafer being processed in accordance with the preferred embodiment of the present invention.

The result of step 120 is shown in FIG. 6. The thin layer of TEOS 520 has been planarized to leave a small portion of TEOS 622 only in the depression 418. The layer of nitride 208 extends on each side of the depression 418. The small portion of TEOS 622 lies immediately above the gate polysilicon 206. This small portion of the TEOS 622 will be used to mask a portion of the underlying gate polysilicon 206 and gate oxide 204 in an etch step that will form the gate.

Referring again to FIG. 1, the next step 122 of method 100 is to remove the remaining portions of the memory layer from the surface of the wafer. This can be done using a suitable etch that is selective to the remaining memory layer. Step 122 exposes the feature material except where it is covered by the remaining portions of the image reversal layer.

Figure 7:
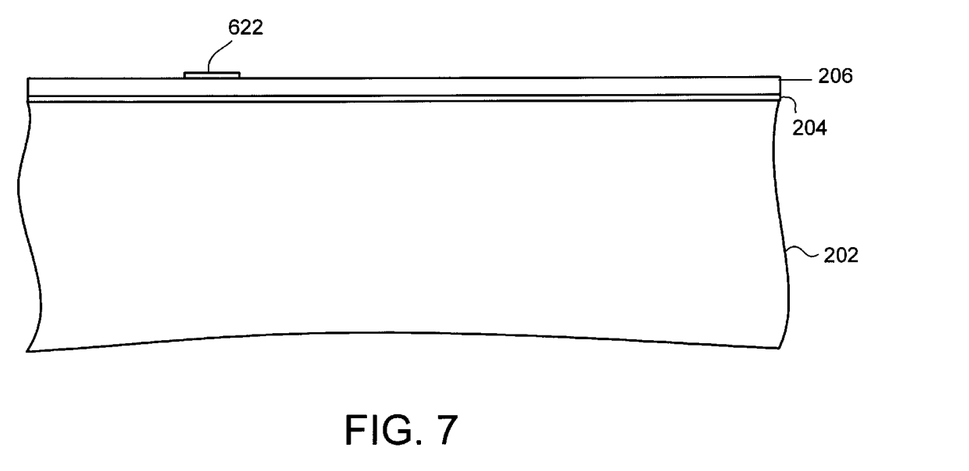
FIG. 7 shows a cross-section of a semiconductor wafer being processed in accordance with the preferred embodiment of the present invention.

The results of step 122 are shown in FIG. 7. The small portion of TEOS 622 overlies a portion of the gate polysilicon 206. The remainder of the gate polysilicon 206 is now at the surface of the wafer 202.

Referring again to FIG. 1, the next step 124 of the method 100 is to use the remaining portion of the image reversal layer as a mask and etch the feature material to form the feature.

Figure 8:
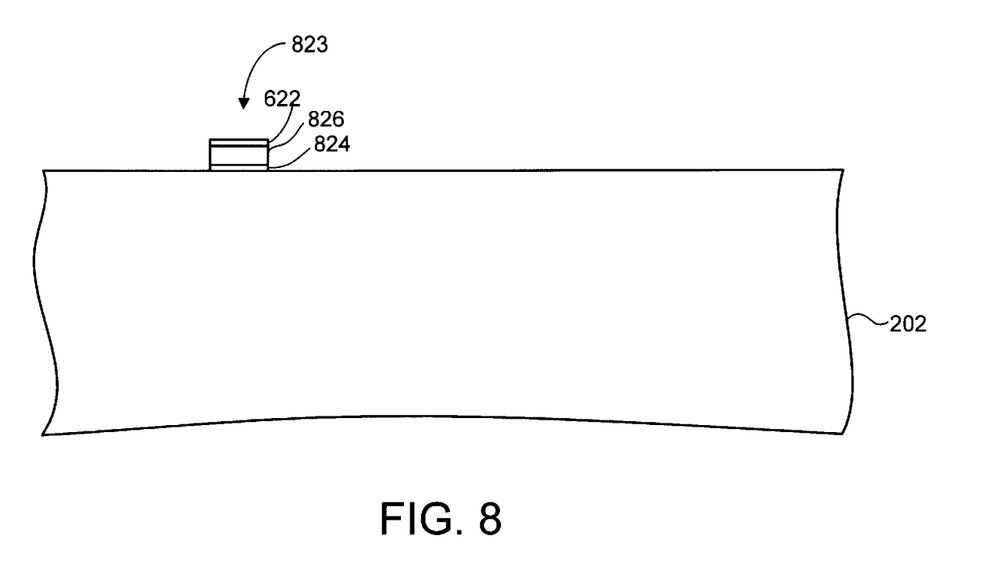
FIG. 8 shows a cross-section of a semiconductor wafer being processed in accordance with the preferred embodiment of the present invention.

The results of step 124 are shown in FIG. 8. A polysilicon stack 823 has been formed consisting of a small portion of TEOS 622 overlaying the polysilicon gate 826 and the gate oxide 824. The TEOS 622 may be removed.

Because the gate was defined using shadow lithography instead of conventional photolithography, its dimensions may be considerably smaller then those attainable using conventional photolithography. For example, if the trough used is of the minimum feature size and the angle of exposure is not perpendicular to the surface of the wafer, the shadow cast at the bottom of the trough and used to define the feature will be less than the minimum feature size attainable with the conventional photolithographic process. Because smaller gates have quicker switching times, a logic circuit created in accordance with the present invention can operate faster than can a gate formed using conventional photolithography.

Figure 9:
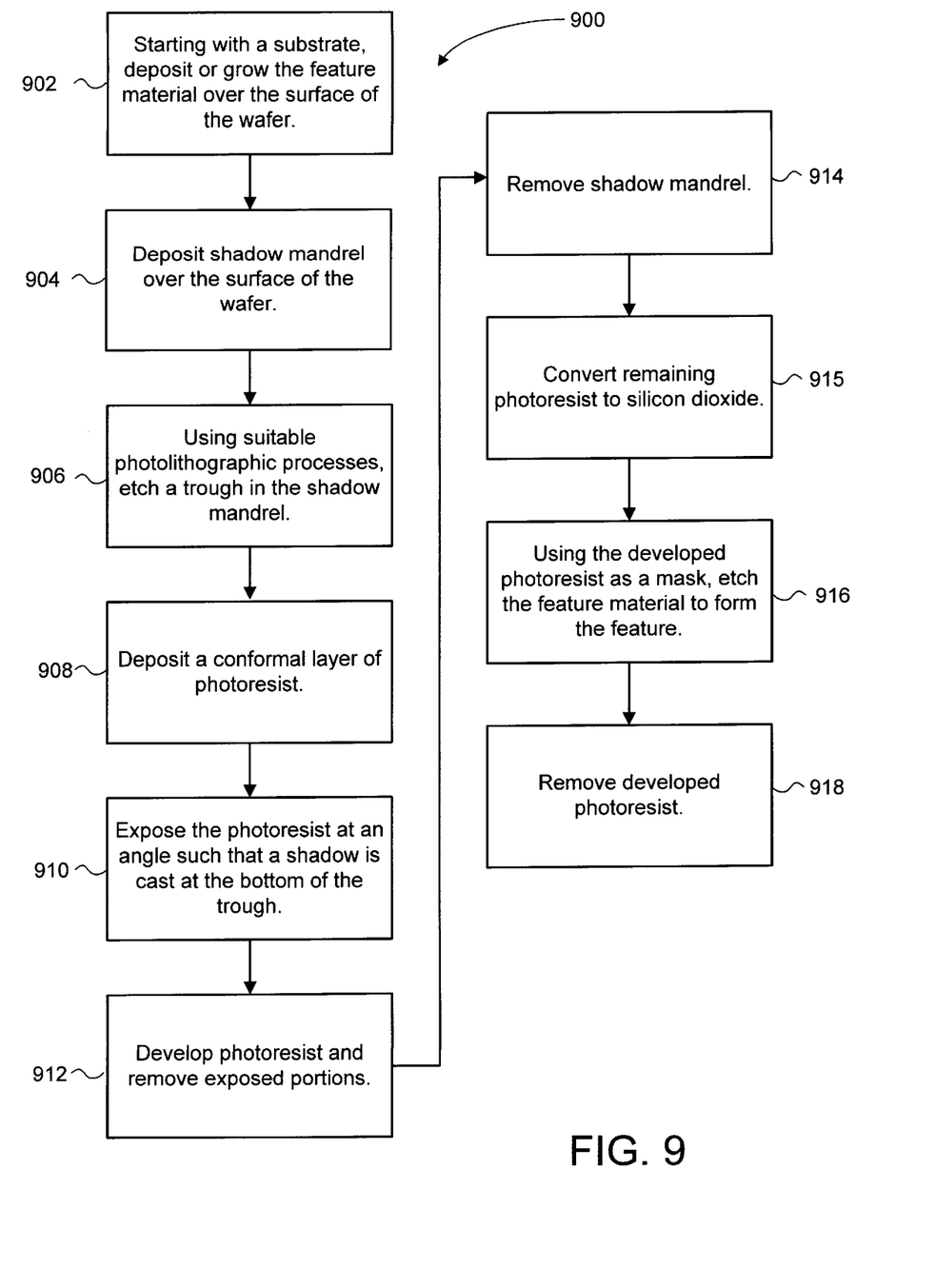
FIG. 9 shows a method in accordance with a second exemplary embodiment.

Referring now to FIG. 9, a method in accordance with the second exemplary embodiment is shown. The second exemplary embodiment uses the same polysilane chemical vapor deposition photoresist as was used with the preferred embodiment. However, in the second exemplary embodiment the photoresist is developed as a positive tone photoresist. The first step 902 of method 900 comprises providing a substrate, typically a planar wafer, and depositing or growing feature material over the surface of the wafer. The feature material may comprise any material suitable for use in forming a gate. Of course, if the feature to be defined is not a gate, material(s) appropriate for that feature should be used. Because the feature defined in accordance with the second exemplary embodiment is a gate, the feature material may comprise a layer of gate oxide and a layer of gate polysilicon. In some circumstances, the substrate itself may appropriately comprise the feature material. The next step 904 of method 900 is to deposit a shadow mandrel layer. According to the second exemplary embodiment, the shadow mandrel comprises a thick layer of polysilicon. As with the preferred embodiment, one skilled in the art will realize that a wide variety of materials may be used. The second exemplary embodiment also differs from the preferred embodiment in that no memory layer is used. In accordance with the second exemplary embodiment, no memory layer is required because developing the photoresist as a positive tone resist eliminates the need to reverse the image of the shadow used to define the feature.

Figure 10:
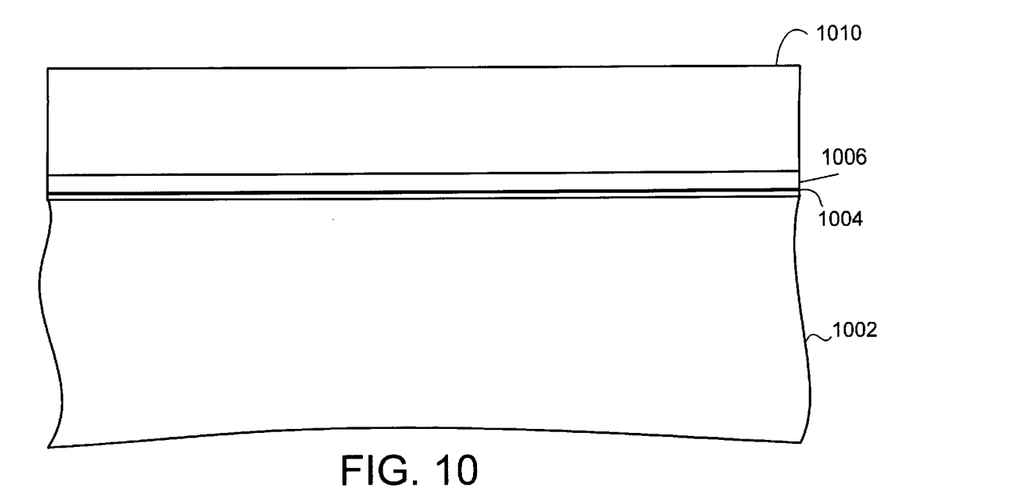
FIG. 10 shows a cross-section of a semiconductor wafer being processed in accordance with the second exemplary embodiment of the present invention.

FIG. 10 shows the result of step 904. Gate oxide 1004 has been grown on the surface of a wafer 1002. Gate polysilicon 1006 has been deposited over the gate oxide 1004. A shadow mandrel comprising a thick layer of polysilicon 1010 has been deposited over the gate polysilicon 1006.

Referring again to FIG. 9, the next step 906 of method 900 is to create a trough in the shadow mandrel using any suitable photolithographic process. Step 906 may include the process of applying a photoresist over the surface of the shadow mandrel, masking and exposing the photoresist to pattern the trough(es), developing the photoresist and etching the trough(es). Preferably, the trough(es) will be the minimum feature size attainable with the photolithographic process used. The next step 908 of method 900 is to deposit a conformal layer of photoresist over the surface of the wafer, including the bottom and sides of the trough. As with the preferred embodiment, a polysilane CVD photoresist is used because it satisfactorily adheres to the sidewalls of the trough. Unlike the preferred embodiment, the method 900 in accordance with the second embodiment develops the resist as a positive tone resist. This development may be accomplished using a hydroflouric acid based developer or a flourine plasma. One skilled in the art will realize that other photoresists may be used in accordance with the invention. The next step 910 of method 900 is to expose the wafer to an ion implant at a non-perpendicular angle such that a shadow is cast in trough. As with the preferred embodiment, the process is preferably performed by implanting oxygen ions into the resist. However, other types of exposures may be used.

Figure 11:
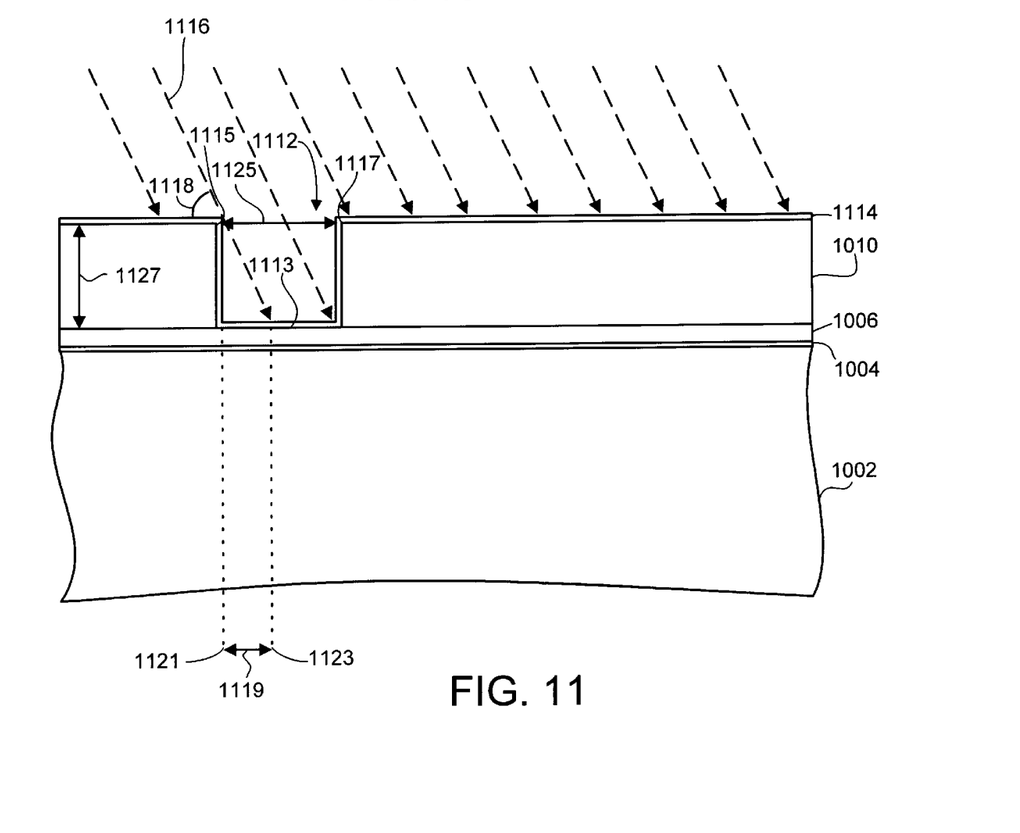
FIG. 11 shows a cross-section of a semiconductor wafer being processed in accordance with the second exemplary embodiment of the present invention.

FIG. 11 illustrates the exposure step 910. A trough 1112 has been etched in the thick layer of polysilicon 1010. The trough 1112 has a bottom 1113, a first sidewall 1115, and a second sidewall 1117. The trough 1112 has a width 1125 and a depth 1127. A conformal layer of polysilane photoresist 1114 has been deposited over the surface of the wafer 1002. The wafer 1002 is then exposed using ion implantation 1116 of oxygen at an angle 1118. The first sidewall 1115 of the trough 1112 therefore casts a shadow 1119 at the bottom 1113 of the trough 1112. Because the second exemplary embodiment develops the polysilane resist as a positive tone resist, after development the photoresist layer 1114 will be removed everywhere except where the shadow 1119 is cast. The dimensions of the shadow 1119 are determined solely by the angle 1118 of exposure and the depth 1127 of the trough 1112. As with the preferred embodiment, if the dimension of the shadow 1119 is designated "s", the depth 1127 of the trough 1112 is designated "d", and the exposure angle 1118 is designated "φ", then the dimension of the shadow 1119 is given by the equation $$s = d \tan(90 - \phi).$$

The thickness of the polysilicon 1010 and the corresponding depth 1127 of the trough 1112 can be controlled with great accuracy, with only approximately one to two percent variance. Likewise, the exposure angle 1118 exposure can be determined very precisely. Thus, the dimension of the shadow 1119 may be tightly controlled. Because ion implantation is used, the shadow's 1119 image is not subject to the diffraction effects of traditional photolithography. The shadow 1119 is self-aligned at its first edge 1121 with the first sidewall 1115 of the trough 1112. The second edge 1123 of the shadow 1119 is determined solely by the exposure angle 1118 and depth 1127 of the trough 1112, as set forth above.

Figure 12:
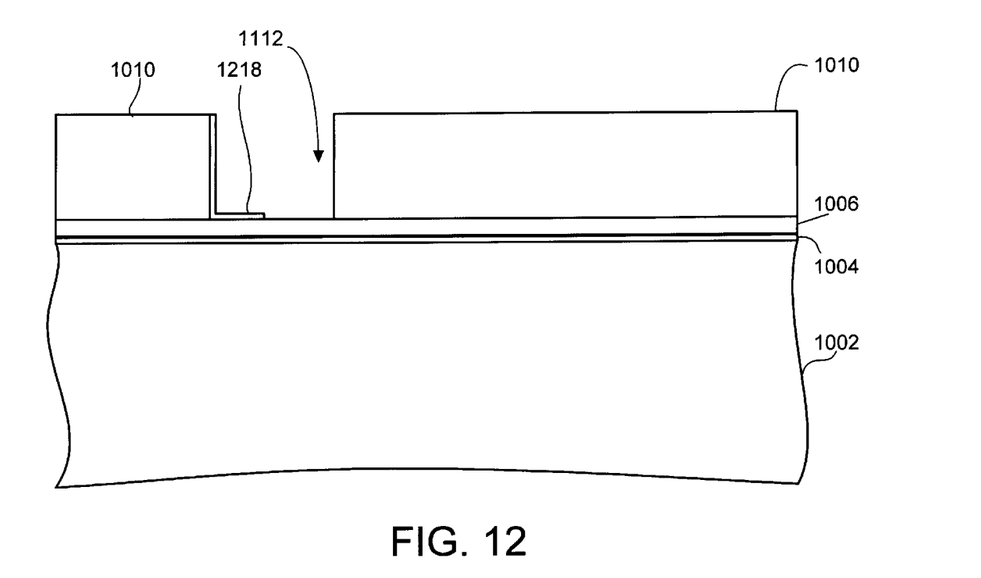
FIG. 12 shows a cross-section of a semiconductor wafer being processed in accordance with the second exemplary embodiment of the present invention.

Referring again to FIG. 9, the next step 912 of the method 900 is to develop the exposed photoresist. In accordance with the second exemplary embodiment, the photoresist is developed as a positive tone resist, as was explained above. Development removes the exposed photoresist and leaves photoresist only where the shadow was cast. The result of step 912 is shown in FIG. 12. The remaining portion 1218 of the photoresist covered by the shadow 1119 remains on the surface of the wafer.

Referring again to FIG. 9, the next step 914 of the method 900 is to remove the remaining portions of the shadow mandrel using HF. The portion of the remaining photoresist which extended up the side of the trough is rigid enough to remain vertical after the shadow mandrel is removed. This upright portion of the photoresist may be removed in a subsequent step. The next step 915 is to convert the remaining photoresist to silicon dioxide so that it may be differentiated from the underlying polysilicon in a subsequent etch step. One way to convert the remaining photoresist is to expose it using a second ion implantation or other suitable exposure method. The remaining photoresist will also convert to silicon dioxide if exposed to atmospheric oxygen for a sufficient period of time. The time required for such a conversion using atmospheric oxygen may be reduced by elevating the ambient temperature. The next step 916 of the method 900 is to use the developed photoresist as a mask to etch the feature material. An appropriate etch may consist of a chlorine or bromine dry etch.

Figure 13:
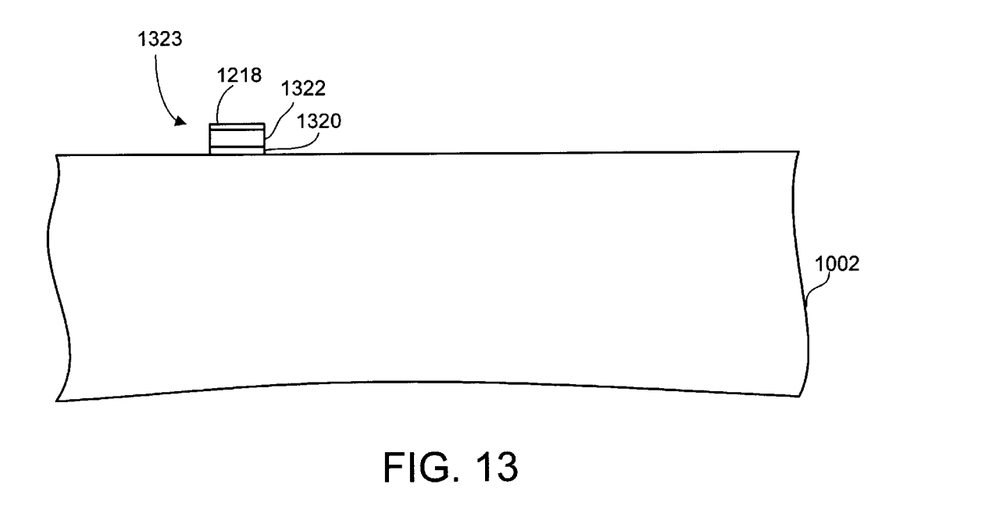
FIG. 13 shows a cross-section of a semiconductor wafer being processed in accordance with the second exemplary embodiment of the present invention.

The result of step 916 is shown in FIG. 13. The remaining photoresist 1218 was used as a mask in the etch of the gate polysilicon 1006 and gate oxide 1004. Accordingly, only a small portion 1322 of the gate polysilicon 1006 remains. Likewise, only a small portion 1320 of the gate oxide 1004 remains. The remaining gate polysilicon 1322 and gate oxide 1320 form the polysilicon stack 1323. Because the dimensions of the polysilicon stack 1323 were determined using shadow lithography, instead of traditional photolithography, the dimensions of the polysilicon stack 1323 may be considerably smaller than that attainable using conventional photolithographic methods.

Referring again to FIG. 9, the next step 918 of method 900 is to optionally remove the remaining photoresist. The remaining photoresist may be removed using dilute HF or HF vapor. Using HF will minimize damage to the gate material if the feature to be defined and formed is a gate. A reactive ion etch (RIE) may also be used. A RIE will minimize damage to source and drain implants, if any are present. The remaining photoresist could also be left in place.

Figure 14:
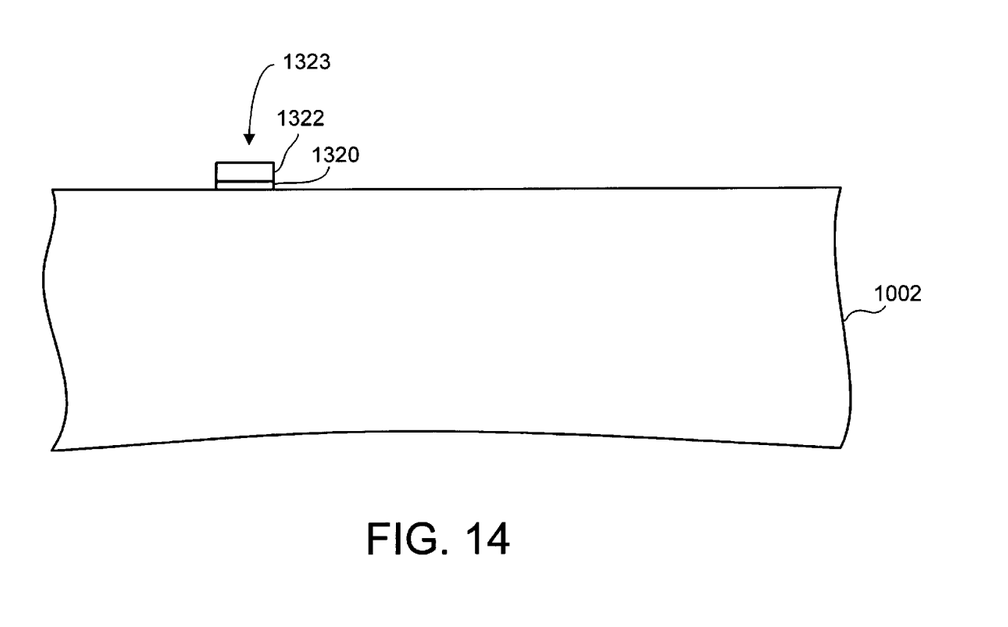
FIG. 14 shows a cross-section of a semiconductor wafer being processed in accordance with the second exemplary embodiment of the present invention.

The completion of step 920 is shown in FIG. 14. In FIG. 14, a polysilicon stack 1323 consisting of gate polysilicon 1322 and gate oxide 1320 remains on the surface of a wafer 1002.

Figure 15:
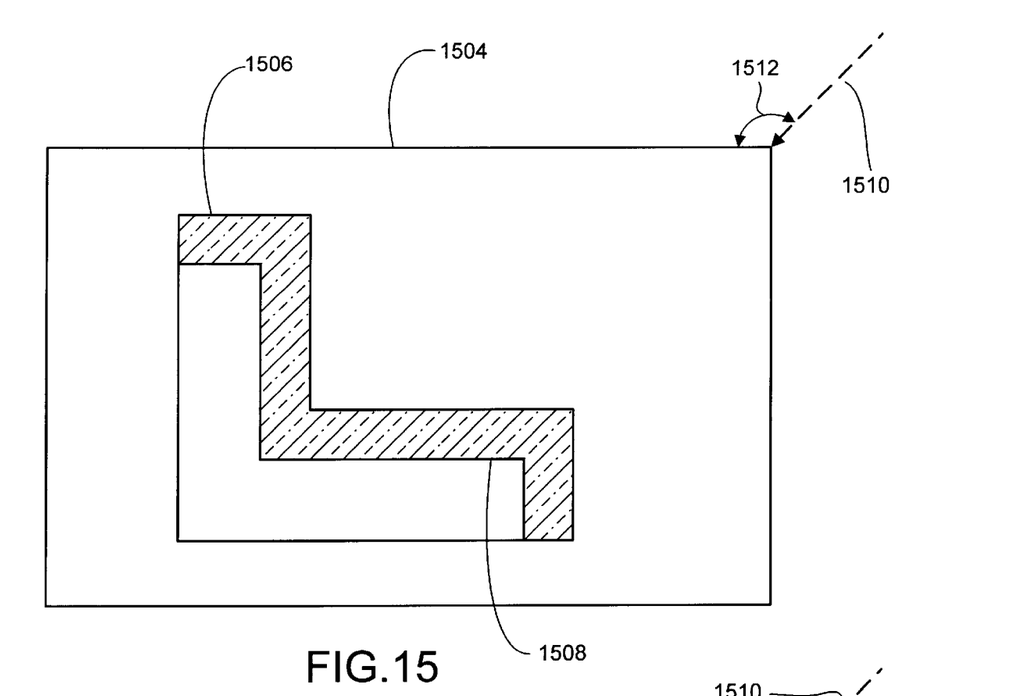
FIG. 15 shows a top view of a semiconductor wafer being processed in accordance with a third exemplary embodiment.
Figure 16:
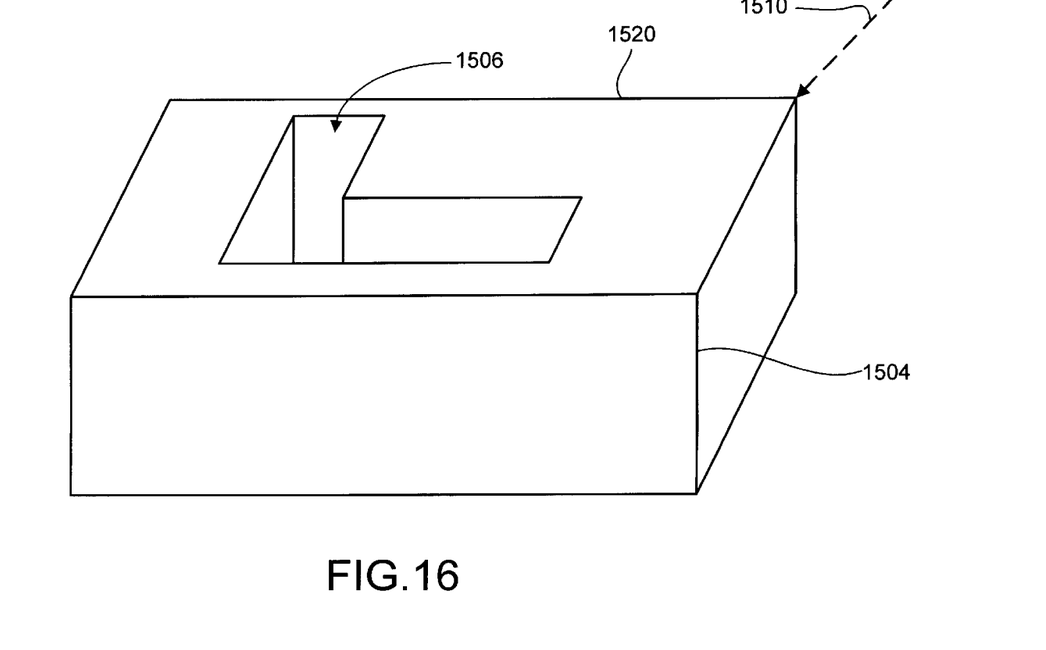
FIG. 16 shows a perspective view of a semiconductor wafer being processed in accordance with a third exemplary embodiment.

Thus far, the invention has been described as using a trough wherein the length of the trough extends in only one direction. However, the invention may use a trough which extends in more than one direction. This is illustrated in FIGS. 15 and 16. The trough 1506 extends along two axes and comprises an "L" shape. Of course, the actual shape of the trough will vary depending upon the user's needs. After the conformal deposition of a photoresist, the surface 1520 of the wafer 1504 is exposed using ion implantation 1510 or any suitable exposure means at an angle such that a shadow 1508 is cast at the bottom of the trough 1506. It is to be noted that in the prior embodiments described the exposure was performed so as to be at a non-perpendicular angle with the surface of the wafer, while still being perpendicular to the length of the trough. In this third exemplary embodiment the exposure is at a non-perpendicular angle to both the surface of the wafer and the two axes of the trough. The shadow 1508 extends along each arm of the trough 1506. The length of the shadow is a function of the ion implantation angle 1512. In this way, the present invention may be used to define a feature extending in more than one direction.

Another way of using shadow lithography is to selectively narrow only specific segments of an existing wiring level. At the gate conductor level, for example, a selective use of the shadow lithography technique would allow sublithographic devices to be fabricated in some parts of the chip, while larger devices could be used for other structures, such as extended wiring patterns, which provide higher conductivity when they are patterned at a larger dimension. In this instance, the sublithographic devices provide high performance transistors, while the larger structures provide low resistance wiring as well as wide gates. The selective use of the shadow technique can be achieved by using a block mask to protect some shapes from the ion implantation beam. Those substrate patterns which are covered by resist at this block mask step will not be altered by the ion implant operation.

Figure 17:
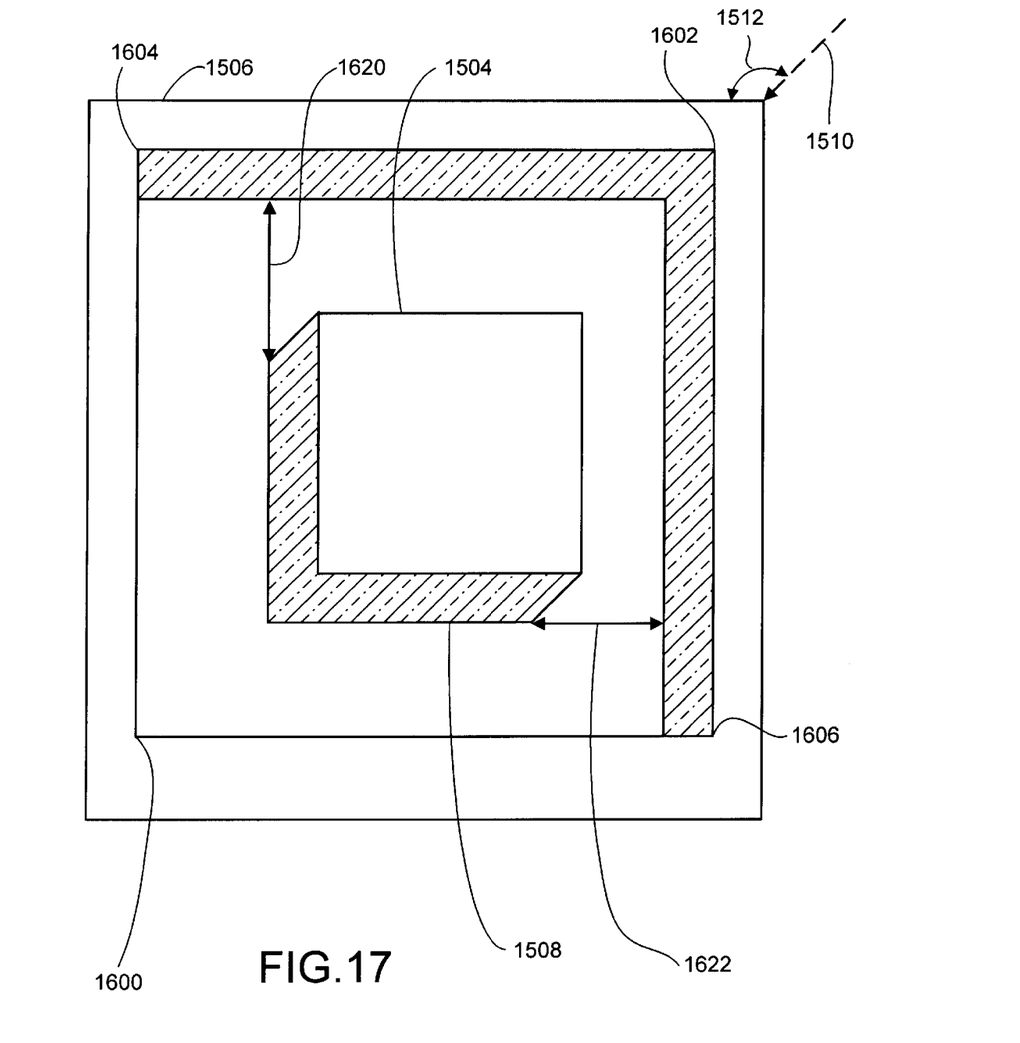
FIG. 17 shows a top view of a semiconductor wafer being processed in accordance with a third exemplary embodiment.
Figure 18:
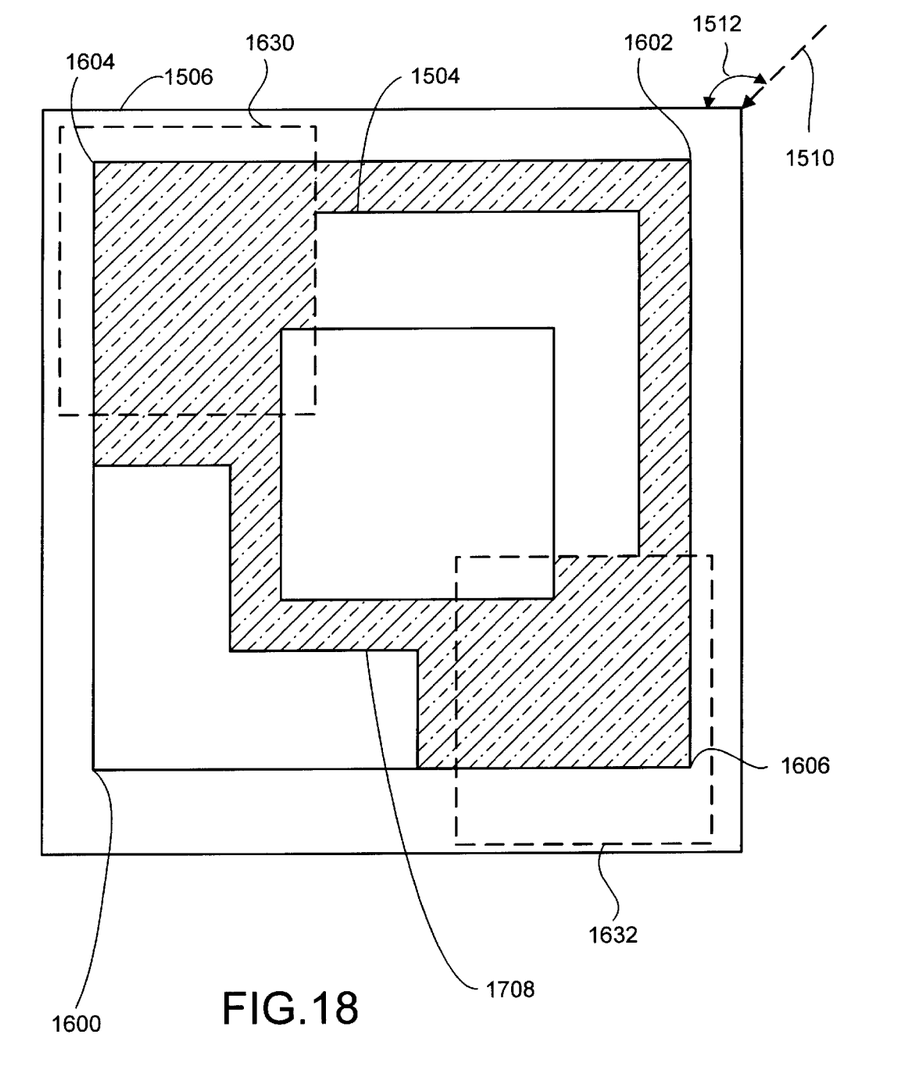
FIG. 18 shows a top view of a semiconductor wafer being processed in accordance with a third exemplary embodiment.

It is also desirable to use this block mask technique in linking sublithographic devices at the locations where they are angled, if the angle causes an unwanted exposure of portions of the feature to the ion implant beam. As can be seen FIG. 17, in a chip design with X and Y feature orientations, there are two possible types of angles that can occur with respect to the ion implantion beam. Corners 1600 and 1602 are defined as bisected by the ion implantion beam, while corners 1604 and 1606 are designated as orthogonal to the ion implant. These two types of corners behave very differently with respect to the shadow casting. The bisected corners exhibit continuous shadow lithographic images, and do not require any additional processing to maintain this continuous shape. However, the orthogonal corners produce shadow lithographic images that are discontinuous around the corners. They are separated by gaps 1620 and 1622. If the chip design requires continuous wiring around such comers, block mask resist shapes 1630 and 1632 may be employed to protect these comers from the ion implantion beam. This mask and the resultant continuous shadow image 1708 are shown in FIG. 18.

In accordance with the above-described invention, a new process referred to as shadow lithography is used to define and form features on a semiconductor substrate. In accordance with the invention, a shadow mandrel layer is deposited over the surface of a wafer. At least one trough is etched in the shadow mandrel layer. A photoresist is layer deposited over the surface of the wafer, including the bottom and sidewalls of the trough. The wafer is then exposed at an angle such that at least one sidewall of the trough casts a shadow in the bottom of the trough. This shadow is used to define a feature.

The invention has been disclosed herein in terms of a preferred embodiment, a second exemplary embodiment, and a third exemplary embodiment. One skilled in the art will realize that numerous variations may be made to the embodiments disclosed herein without departing from the scope of the invention. For example, the actual materials and substances used as a photoresist or as the shadow mandrel, memory layer, image reversal layer, or feature material may vary. Likewise, the dimensions of the assorted layers, troughs and angles of exposure disclosed herein may be varied without departing from the scope of the invention. The type of exposure used also need not be an ion implantation exposure as described herein, but may comprise an optical, ultra-violet, deep ultra-violet, x-ray, or electron exposure.

What is claimed is:

1. A method for defining a feature on a substrate, the method comprising the steps of:
   a. depositing a memory layer on the substrate;
   b. depositing a shadow mandrel layer on the memory layer;
   c. etching a trough in the shadow mandrel layer, the trough having a sidewall and a bottom;
   d. depositing a layer of photoresist over the shadow mandrel layer and the trough;
   e. exposing the photoresist layer at an angle such that the photoresist at a first portion of the trough bottom is exposed and the photoresist at a second portion of the trough bottom is blocked by the trough sidewall and unexposed;
   f. developing the photoresist layer;
   g. defining the feature using the developed photoresist layer;
   h. depositing an image reversal layer over the memoiry layer so as to fill the depression;
   i. removing the excess portions of the image reversal layer such that only a first portion of the image reversal layer remains in the depression;
   j. removing the memory layer; and k. forming the feature by removing the layer of feature material except where it underlies the remaining first portion of the image reversal layer.

2. The method of claim 1 wherein the photoresist layer is a negative tone photoresist.

3. The method of claim 1 wherein the step of developing the photoresist layer comprises removing the unexposed photoresist of the second portion of the trough bottom.

4. The method of claim 1 wherein the photoresist layer is deposited using chemical vapor deposition.

5. A method for defining a feature on a substrate, the method comprising the steps of:
   a. depositing a shadow mandrel laer on the substrate;
   b. etching a trough in the shadow mandrel layer, the trough having a sidewall and a bottom;
   c. depositing a layer of photoresist over the shadow mandrel layer and the trough, wherein the photoresist layer is a positive tone photoresist;
   d. exposing the photoresist layer at an angle such that the photoresist at a first portion of the trough bottom is exposed and the photoresist at a second portion of the trough bottom is blocked by the trough sidewall and unexposed;
   e. developing the photoresist layer; and
   f. defining the feature using the developed photoresist layer.

6. The method of claim 5 wherein the step of developing the photoresist layer comprises removing the exposed photoresist from the first portion of the trough bottom and wherein the step of defining the feature using the developed photoresist further comprises using the remaining photoresist of the unexposed second portion to define the feature.

7. The method of claim 6 wherein the step of using the remaining photoresist of the unexposed second portion further comprises using the remaining photoresist as a hard mask while etching the underlying substrate, such that the substrate underlying the remaining photoresist is not etched.

8. The method of claim 7 wherein the substrate is a gate conductor.

9. A method for defining a feature on a substrate, the method comprising the steps of:
   a. depositing a shadow mandrel layer on the substrate;
   b. etching a trough in the shadow mandrel layer, the trough having a sidewall and a bottom;
   c. depositing a layer of photoresist over the shadow mandrel layer and the trough, wherein the photoresist layer comprises a polysilane photoresist;
   d. exposing the photoresist layer at an angle such that the photoresist at a first portion of the trough bottom is exposed and the photoresist at a second portion of the trough bottom is blocked by the trough sidewall and unexposed;
   e. developing the photoresist layer; and
   f. defining the feature using the developed photoresist layer.

10. The method of claim 9 wherein the step of exposing the photoresist comprises implanting oxygen ions into the photoresist.

11. The method of claim 10 wherein the step of developing the photoresist layer comprises developing the polysilane as a negative to photoresist using a chlorine developer.

12. The method of claim 10 wherein the step of developing the photoresist layer comprises developing the polysilane as a positive tone photoresist using a hydroflouric acid developer.

13. The method of claim 10 wherein the step of developing the photoresist layer comprises developing the polysilane as a positive tone photoresist by using flourine plasma to develop the photoresist layer.

14. The method of claim 9 wherein the step of depositing the polysilane photoresist comprises the chemical vapor deposition of the polysilane photoresist.

15. A method for defining a feature on a substrate, the method comprising the steps of:
   a. depositing a shadow mandrel laver on the substrate;
   b. etching a trough in the shadow mandrel layer, the trough having a sidewall and a bottom;
   c. depositing a layer of photoresist over the shadow mandrel layer and the trough, wherein the photoresist layer comprises polysilicon;
   d. exposing the photoresist layer at an angle such that the photoresist at a first portion of the trough bottom is exposed and the photoresist at a second portion of the trough bottom is blocked by the trough sidewall and unexposed;
   e. developing the photoresist layer; and
   f. defining the feature using the developed photoresist layer.

16. The method of claim 15 wherein the step of exposing the photoresist comprises implanting boron ion to the photoresist.

17. The method of claim 16 wherein the step of developing the photoresist layer comprises developing the polysilicon as a negative tone photoresist using a potassium hydroxide developer.

18. A method for defining a feature on a substrate, the method comprising the steps of:
   a. depositing a shadow mandrel layer on the substrate;
   b. etching a trough in the shadow mandrel layer, the trough having a sidewall and a bottom, wherein the trough extends along two axes;
   c. depositing a layer of photoresist over the shadow mandrel laver and the trough;
   d. exposing the photoresist layer at an angle such that the photoresist at a first portion of the trough bottom is exposed and the photoresist at a second portion of the trough bottom is blocked by the trough sidewall and unexposed, and wherein the step of exposing the photoresist further comprises exposing the photoresist at a non-perpendicular angle relative to the two axes of the trough such that the unexposed second portion of the trough bottom extends along two axes;
   e. developing the photoresist layer; and
   f. defining the feature using the developed photoresist layer.

19. The method of claim 18 wherein the step of exposing the photoresist comprises implanting ions into the photoresist.

20. The method of claim 19 further comprising the step of using block mask resist shapes to prevent a third portion of the trough bottom from being exposed.

21. The method of claim 18 wherein the feature defined is a gate.

22. The method of claim 18 wherein the feature defined is a contact hole.

23. A method for forming a feature on a semiconductor wafer comprising the steps of:
   a. depositing a layer of feature material over the surface of the semiconductor wafer;
   b. depositing a shadow mandrel layer over the layer of feature material;
   c. etching a trough having a bottom and sides through the shadow mandrel layer;
   d. applying a conformal photoresist layer over the shadow mandrel;

e. exposing the photoresist layer using ion implantation such that at least one side of the trough casts a shadow at the bottom of the trough, the shadow being cast in a first portion of the trough bottom, the photoresist in the first portion thereby being unexposed while the remainder of the photoresist is exposed;

f. developing the photoresist such that only the unexposed photoresist in the first portion of the trough bottom remains and the exposed photoresist is removed;

g. removing the shadow mandrel layer; and h. removing the feature material from the surface of the wafer except at the first portion where the shadow was cast.

24. The method of claim 23 wherein the step of etching a trough in the shadow mandrel layer comprises the steps of applying a photoresist layer over the shadow mandrel layer, patterning the trough by exposing the photoresist through a mask, developing the photoresist to expose portions of the shadow mandrel layer, and etching the exposed portion of the shadow mandrel layer to form the trough.

25. The method of claim 24 wherein the trough has a dimension substantially equal to the minimum photolithographic feature size attainable with the photolithographic process used.

26. The method of claim 23 wherein the shadow mandrel layer comprises a thick layer of TEOS.

27. The method of claim 23 wherein the feature material comprises a gate conductor.

28. The method of claim 23 wherein the feature material further comprises a layer of a gate dielectric.

29. The method of claim 23 wherein the photoresist is deposited using chemical vapor deposition.

30. The method of claim 23 wherein the photoresist layer comprises polysilane photoresist.

31. The method of claim 26 wherein the step of exposing the photoresist layer using ion implantation comprises implanting oxygen.

32. The method of claim 31 wherein the step of developing the photoresist layer comprises developing the polysilane using a hydroflouric acid developer.

33. The method of claim 31 wherein the step of developing the photoresist layer comprises developing the polysilane using flourine plasma.

34. The method of claim 23 wherein the step of removing the feature material from the surface except at the first portion where the shadow was cast comprises etching the feature material while using the remaining photoresist in the first portion as a hard mask to prevent the feature material underlying the first portion of photoresist from being etched.

35. The method of claim 23 wherein the trough extends along two axes and has a plurality of corners and wherein the step of exposing the photoresist further comprises exposing the photoresist such that at least one corner of the trough is bisected by the exposure and at least one corner of the trough is substantially orthogonal to the exposure.

36. The method of claim 35 further comprising the step of blocking the bottom of the trough at the orthogonal corners with block mask resist shapes to form a continuous shadow image during the step of exposing the photoresist layer.

37. A method for forming a feature on a semiconductor wafer comprising the steps of:

a. depositing a layer of feature material over the surface of the semiconductor wafer;

b. depositing a memory layer over the layer of feature material;

c. depositing a shadow mandrel layer over the memory layer;

d. etching a trough having a bottom and sides through the shadow mandrel layer;

e. applying a conformal layer of photoresist over the shadow mandrel layer and trough;

f. exposing the photoresist using ion implantation such that at least one side of the trough casts a shadow at the bottom of the trough on a first portion of the photoresist, such that the first portion at the photoresist is unexposed while a second portion of the photoresist is exposed;

g. developing the photoresist to remove the unexposed first portion of the photoresist;

h. etching the memory layer underlying the first portion of the photoresist so as to form a depression in the memory layer corresponding to the unexposed first portion of the photoresist;

i. removing the shadow mandrel layer;

j. depositing an image reversal layer over the memory layer so as to fill the depression;

k. removing the excess portions of the image reversal layer such that only a first portion of the image reversal layer remains in the depression;

l. removing the memory layer; and m. forming the feature by removing the layer of feature material except where it underlies the remaining first portion of the image reversal layer.

38. The method of claim 37 wherein:

the memory layer comprises a layer of nitride;

the shadow mandrel layer comprises a thick layer of TEOS; and the image reversal layer comprises a thin layer of TEOS.

39. The method of claim 37 wherein:

the memory layer comprises a layer of nitride;

the shadow mandrel layer comprises a thick layer of polysilicon; and the image reversal layer comprises a thin layer of TEOS.

40. The method of claim 37 wherein the feature material comprises a layer of polysilicon and a layer of silicon dioxide.

41. The method of claim 37 wherein the conformal layer of photoresist comprises a polysilane photoresist.

42. The method of claim 37 wherein the step of exposing the photoresist using ion implantation comprises implanting oxygen.

43. The method of claim 42 wherein the step of developing the photoresist layer comprises using a chlorine developer.

44. The method of claim 37 wherein the photoresist layer comprises polysilicon.

45. The method of claim 44 wherein the step of exposing the photoresist layer using ion implantation comprises implanting boron.

46. The method of claim 45 wherein the step of developing the photoresist comprises developing the polysilicon using a potassium hydroxide developer.

47. The method of claim 37 wherein the trough extends along two axes and has a plurality of corners, and wherein the step of exposing the photoresist further comprises exposing the photoresist such that at least one corner of the trough is bisected by the exposure and at least one corner of the trough is substantially orthogonal to the exposure.

48. The method of claim 47 further comprising the step of blocking the bottom of the trough at the orthogonal corners with block mask resist shapes to form a continuous shadow image during the step of exposing the photoresist layer.

* * * * *